(12) United States Patent
Chen et al.

(10) Patent No.: US 12,666,547 B2
(45) Date of Patent: Jun. 23, 2026

(54) STORAGE DEVICE HEAT-MITIGATING ENCLOSURE

(71) Applicant: Sandisk Technologies, Inc., Milpitas, CA (US)

(72) Inventors: Li Chen, Sunnyvale, CA (US); Beng Gian Ooi, Penang (MY); Fu Xing Chan, Penang (MY); Ye Bai, Shanghai (CN); Kai Liu, Dublin, CA (US); Chaolun Zheng, San Jose, CA (US); Bo Yang, Dublin, CA (US); Ning Ye, San Jose, CA (US); Toshiki Hirano, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 132 days.

(21) Appl. No.: 18/747,860

(22) Filed: Jun. 19, 2024

(65) Prior Publication Data

US 2025/0393137 A1 Dec. 25, 2025

(51) Int. Cl.
*H05K 5/00* (2025.01)

(52) U.S. Cl.
CPC .................................. *H05K 5/0047* (2013.01)

(58) Field of Classification Search
CPC ............. H05K 5/0047; H05K 7/20154; H05K 7/2039; H05K 5/026; H05K 1/0201; H05K 1/0203; G06F 1/20
See application file for complete search history.

(56) References Cited

U.S. PATENT DOCUMENTS

| | | | |
|---|---|---|---|
| 6,980,418 B1 * | 12/2005 | Seeger | .................... G06F 1/203 |
| | | | 438/758 |
| 9,536,805 B2 | 1/2017 | Fazelpour et al. | |
| 10,149,399 B1 | 12/2018 | Mangay-Ayam, Jr. et al. | |
| 11,013,141 B2 | 5/2021 | Gary | |
| 2015/0208550 A1 * | 7/2015 | Rugg | ................. G11B 33/1426 |
| | | | 361/713 |

(Continued)

FOREIGN PATENT DOCUMENTS

| | | | | |
|---|---|---|---|---|
| CN | 109196967 A | * | 1/2019 | .......... H01L 23/467 |
| CN | 117331403 A | | 1/2024 | |
| WO | WO-2023033785 A1 | * | 3/2023 | ............... H01G 9/12 |

OTHER PUBLICATIONS

Machine Translation for CN109196967A (Year: 2025).*

(Continued)

*Primary Examiner* — Allen L Parker
*Assistant Examiner* — Peter Krim
(74) *Attorney, Agent, or Firm* — DENTONS Durham Jones Pinegar

(57) ABSTRACT

In the context of an electronic storage device such as a solid-state drive, a heat-mitigating enclosure includes one or more thermal conduction inhibitor interposed in the respective top or bottom enclosing structure and positioned between a relatively high-temperature electronic component such as an ASIC controller and/or PMIC of a corresponding PCB and a relatively low-temperature electronic component such as NAND memory. Such a thermal conduction inhibitor may include one or more through-hole through the enclosure structure and/or a recess extending into the enclosure structure, with or without a low thermal conductivity material embedded therein.

20 Claims, 7 Drawing Sheets

(56) References Cited

U.S. PATENT DOCUMENTS

| | | | | |
|---|---|---|---|---|
| 2015/0241933 A1* | 8/2015 | Liao | G06F 1/187 | |
| | | | 361/679.39 | |
| 2020/0137896 A1* | 4/2020 | Elenitoba-Johnson | | |
| | | | G06F 13/409 | |
| 2020/0174533 A1* | 6/2020 | Long | H05K 7/20145 | |
| 2021/0161039 A1* | 5/2021 | Jung | H05K 9/0081 | |
| 2021/0378135 A1* | 12/2021 | Wang | G06F 1/20 | |
| 2023/0251696 A1 | 8/2023 | Turmes et al. | | |
| 2023/0345614 A1* | 10/2023 | Lau | H05K 3/303 | |
| 2024/0098940 A1* | 3/2024 | Chung | H05K 7/2049 | |
| 2024/0386917 A1* | 11/2024 | Utz | H05K 5/026 | |

OTHER PUBLICATIONS

Icy Dock, EDSFF E1.S SSD to PCIe 4.0 x4 Removable SSD Mobile Rack for PCIe Expansion Slot, 5 pages, copyright 2022, downloaded as early as Mar. 26, 2024 from https://www.icydockpl.pl/goods.php?id=326.

Scriber, Mike Sr., How EDSFF is Making NVMe® Technology Even Cooler, 6 pages, NVM Express, copyright 2024, downloaded as early as Mar. 26, 2024 from https://nvmexpress.org/how-edsff-is-making-nvme-technology-even-cooler/.

Innodisk Corporation, E1.S 4TG2-P EDSFF Flash Storage Solutions—Innodisk, 4 pages, Innodisk, copyright 2024, downloaded as early as Mar. 26, 2024 from https://www.innodisk.com/en/products/flash-storage/edsff/e1.s-4tg2-p.

Wu, Qu et al., Exploiting Heat-Accelerated Flash Memory Wear-Out Recovery to Enable Self-Healing SSDs, 5 pages, ECSE Department, usenix, downloaded as early as Mar. 26, 2024 from https://www.usenix.org/legacy/event/hotstorage11/tech/final_files/Wu.pdf.

Amazon.com, TDBT M.2 NVMe SSD Enclosure with Heat Sink, 8 pages, Amazon.com, downloaded as early as Mar. 26, 2024 from https://www.amazon.in/TDBT-Enclosure-Thermal-Cooling-External/dp/B07TJT6W8K.

ATP, How to Sustain Performance for NVMe Drives Under Thermal Stress Conditions, 6 pages, downloaded as early as Mar. 26, 2024 from https://www.atpinc.com/de/blog/is-heatsink-needed-for-nvme-ssd.

Oh, Eunho et al., FEA-based Layout Optimization of E1.S Solid-State Drive to Improve Thermal Cycling Reliability, 6 pages, IEEE, copyright 2024, downloaded as early as Mar. 26, 2024 from https://ieeexplore.ieee.org/document/10100844.

* cited by examiner

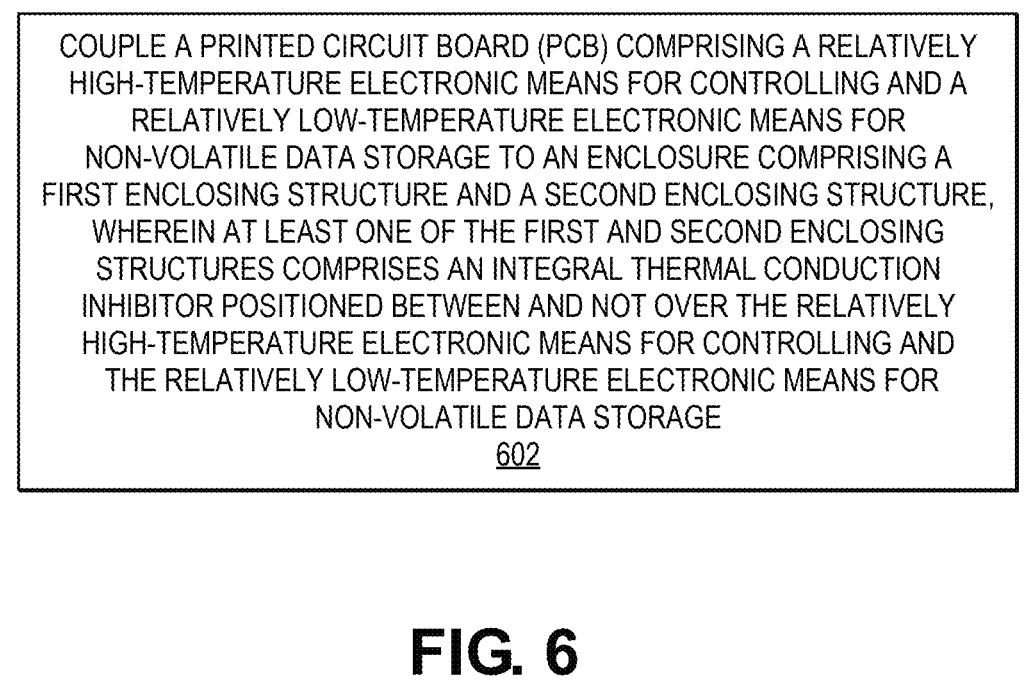

COUPLE A PRINTED CIRCUIT BOARD (PCB) COMPRISING A RELATIVELY HIGH-TEMPERATURE ELECTRONIC MEANS FOR CONTROLLING AND A RELATIVELY LOW-TEMPERATURE ELECTRONIC MEANS FOR NON-VOLATILE DATA STORAGE TO AN ENCLOSURE COMPRISING A FIRST ENCLOSING STRUCTURE AND A SECOND ENCLOSING STRUCTURE, WHEREIN AT LEAST ONE OF THE FIRST AND SECOND ENCLOSING STRUCTURES COMPRISES AN INTEGRAL THERMAL CONDUCTION INHIBITOR POSITIONED BETWEEN AND NOT OVER THE RELATIVELY HIGH-TEMPERATURE ELECTRONIC MEANS FOR CONTROLLING AND THE RELATIVELY LOW-TEMPERATURE ELECTRONIC MEANS FOR NON-VOLATILE DATA STORAGE
602

FIG. 6

STORAGE DEVICE HEAT-MITIGATING ENCLOSURE

FIELD OF EMBODIMENTS

Embodiments of the invention may relate generally to electronic devices such as solid-state storage devices, and particularly to a heat-mitigating storage device enclosure.

BACKGROUND

Enterprise solid-state storage devices, or solid-state drives (SSDs), are commonly used in client, hyperscale and enterprise compute environments. Since SSDs are made from flash memory (e.g., NAND (NOT AND) flash memory), they can be built in many different form factors and are typically associated with industry standard form factors and corresponding mechanical dimensions and electrical interface specifications and protocols. For example, a family of specifications referred to as Enterprise and Datacenter Standard Form Factor (EDSFF) were developed to address the concerns of data center storage. For example, EDSFF E1.L specifies a form factor designed to fit vertically in a 1 U storage system enclosure and is about three times the length of an EDSFF E1.S and supports up to 48 standard NAND sites. With the high capacity storage of the E1.L form factor, a single 1 U enclosure can store up to 32 drives. It is well-known that electronic devices generally and SSDs in particular dissipate power in the form of heat, which requires significant cooling and related costs, and can adversely affect performance, reliability, TCO (total cost of ownership), life span, and the like.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 6 is a flow diagram illustrating a method of assembling a data storage device, according to an embodiment.

DETAILED DESCRIPTION

Figure 1:
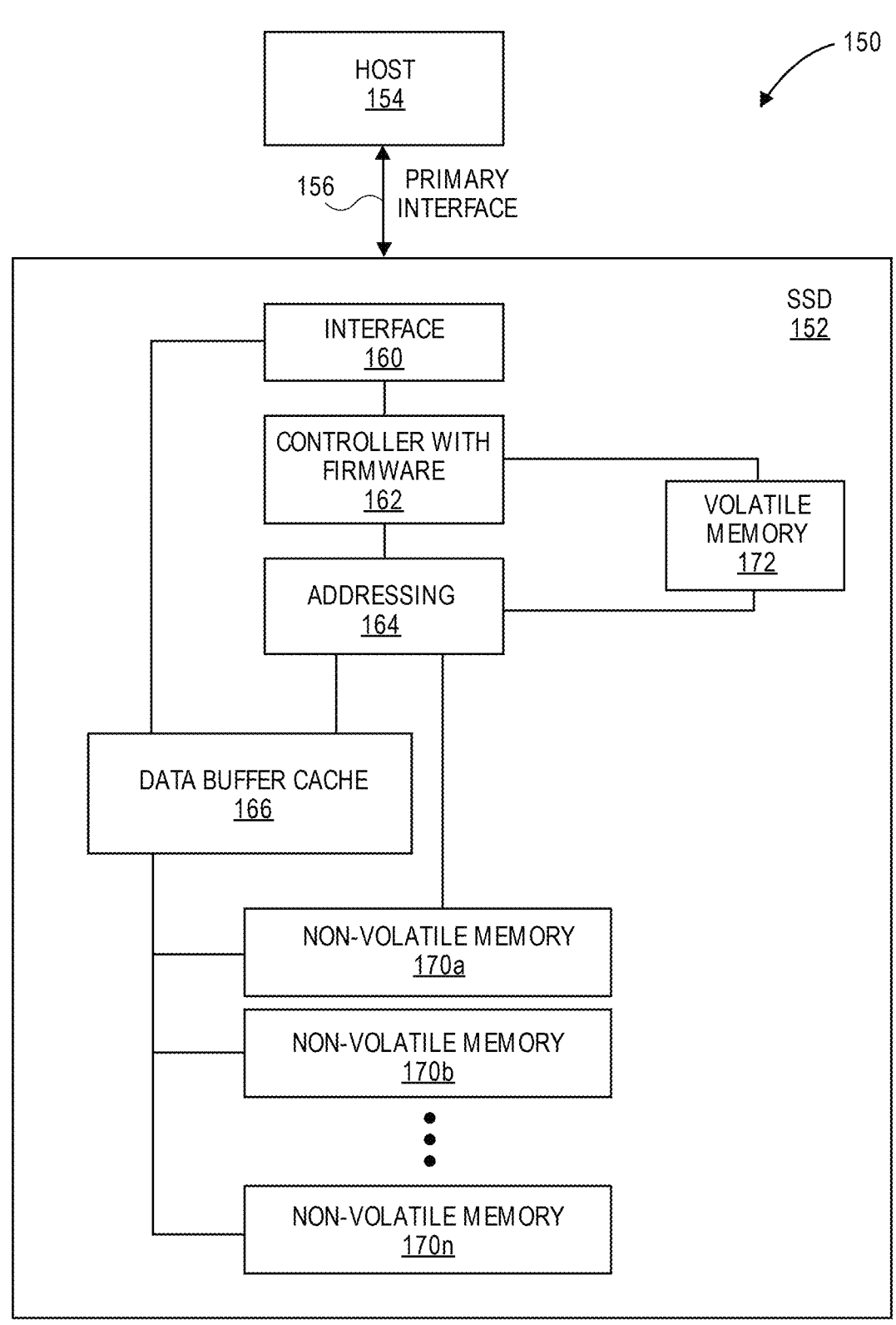
FIG. 1 is a block diagram illustrating a solid-state drive (SSD), according to an embodiment.

Generally, approaches to a heat-mitigating storage device enclosure, such as for solid-state drives, are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices may be shown in block diagram form to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that electronic devices generally and SSDs in particular dissipate power in the form of heat, which requires significant cooling and related costs and can adversely affect multiple factors during the life cycle of an SSD. Note also that generally there are two heat regions in the context of an SSD, e.g., a high temperature region and a low temperature region. The main heat spreaders associated with each region generally are the ASIC (application specific integrated circuit; generally "a controller", for controlling operation of the device)/PMIC (power management integrated circuit, for managing/controlling power for the device) for the high temperature region and the NAND dies for the low temperature region. Thus, there is motivation for pursuing improved drive performance by reducing heat spreading effects from the relatively hot controller(s) region(s) to the relatively cool NAND region(s).

Heat-Mitigating Storage Device Enclosure

According to an embodiment, the relatively low temperature region is isolated from the high temperature region by interrupting or intervening in the structural continuity of the enclosure structure, with or without an additional low thermal conductivity material to serve as thermal insulation.

Figure 2:
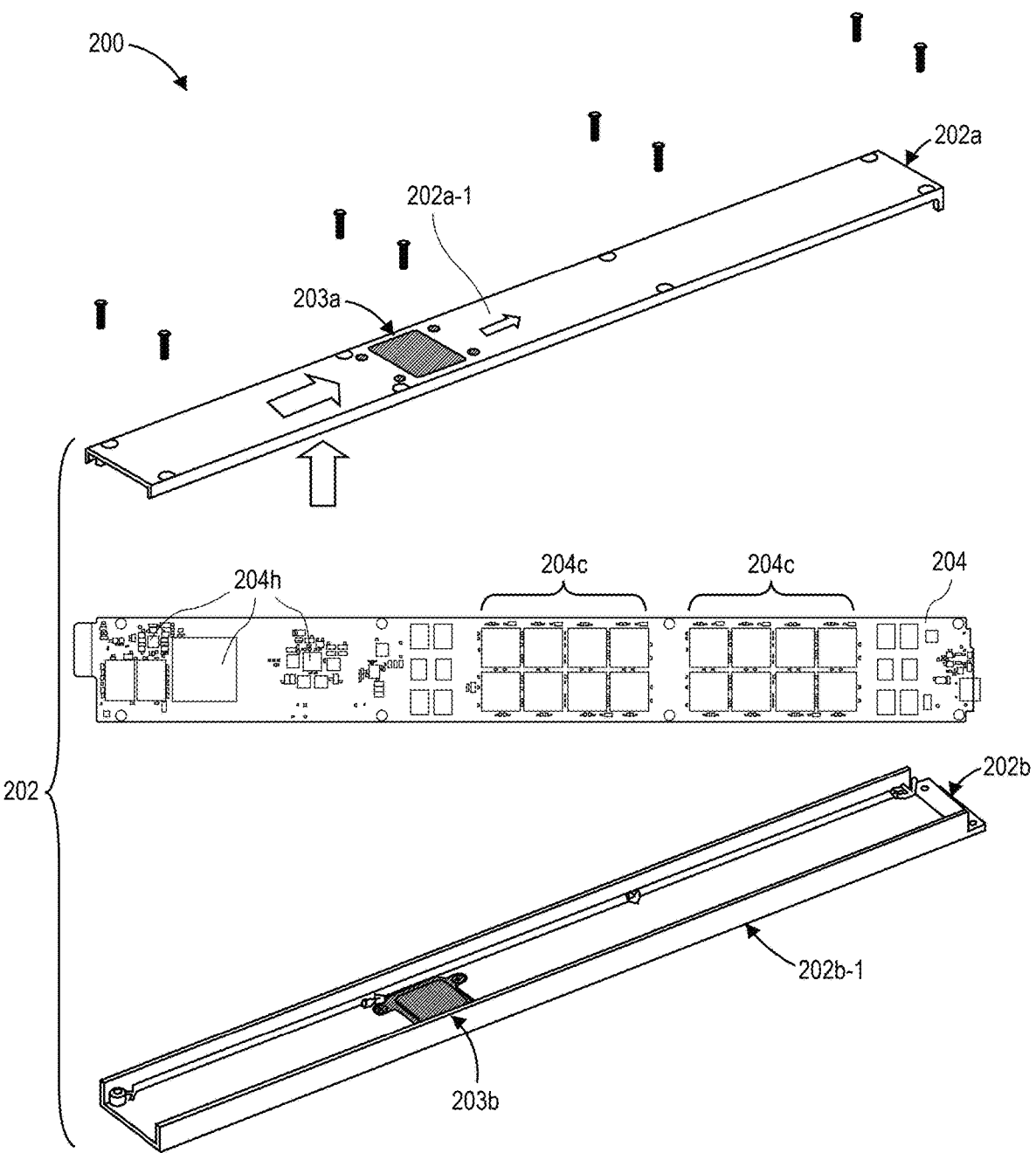
FIG. 2 is an exploded view illustrating an SSD with a heat-mitigating enclosure, according to an embodiment.

FIG. 2 is an exploded view illustrating an SSD with a heat-mitigating enclosure, according to an embodiment. Solid-state storage device 200 (or "solid-state drive" or "SSD") comprises a printed circuit board (PCB) 204 housed in heat-mitigating enclosure 202 (or simply "enclosure 202"). Enclosure 202 comprises a first (e.g., top) enclosure part 202*a* comprising a first enclosing structure 202*a*-1 (e.g., the main structural body running the length of the device 200), and a second (e.g., bottom) enclosure part 202*b* coupled with the first enclosure part 202*a* and comprising a second enclosing structure 202*b*-1. According to an embodiment, at least one of the top and bottom enclosure parts 202*a*, 202*b* comprises a thermal conduction inhibitor 203*a*, 203*b* interposed in the respective top or bottom enclosing structure 202*a*-1, 202*b*-1 and positioned between a relatively high-temperature electronic component 204*h* ("h" for hot) of the PCB 204 and a relatively low-temperature electronic component 204*c* ("c" for cool) of the PCB 204. The one or more thermal conduction inhibitor 203*a*, 203*b* is positioned between the relatively high and low temperature components 204*h*, 204*c* or regions of PCB 204 to mitigate, inhibit the heat spreading effect from the hotter high-temperature component(s) 204*h* to the cooler low-temperature component(s) 204*c* via thermal conduction within the respective first and second enclosing structure 202*a*-1, 202*b*-1. According to an embodiment, each of the first and second enclosure parts 202*a*, 202*b* comprises a respective thermal conduction inhibitor 203*a*, 203*b* (as depicted in FIG. 2 et seq.).

For example and according to an embodiment, the relatively high-temperature electronic component(s) 204*h* of PCB 204 is or includes a controller integrated circuit component (e.g., an SSD ASIC (application-specific integrated circuit) controller) and/or a power management integrated circuit component (PMIC), and the relatively low-temperature electronic component(s) 204*c* is or includes one or more solid-state memory component, such as NAND memory dies. Consequently, in this context the NAND temperature is expected to decrease while the ASIC temperature is expected to increase because of reduced heat conduction through the enclosure 202*a*, 202*b*. Thus, drive performance enhancement is expected due to a reduced heat regime for the NAND memory.

Figure 3A:
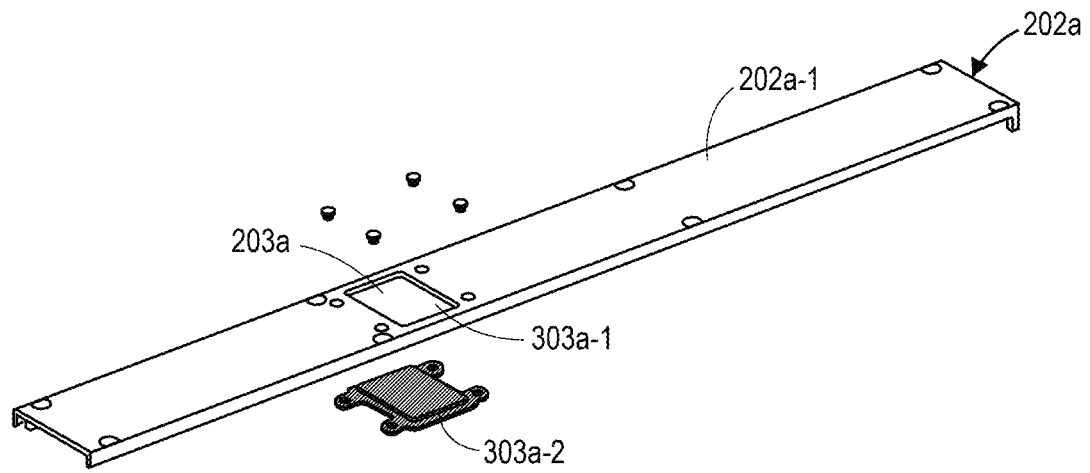
FIG. 3A is an exploded perspective view illustrating a top enclosure assembly for the SSD of FIG. 2, according to an embodiment.
Figure 3B:
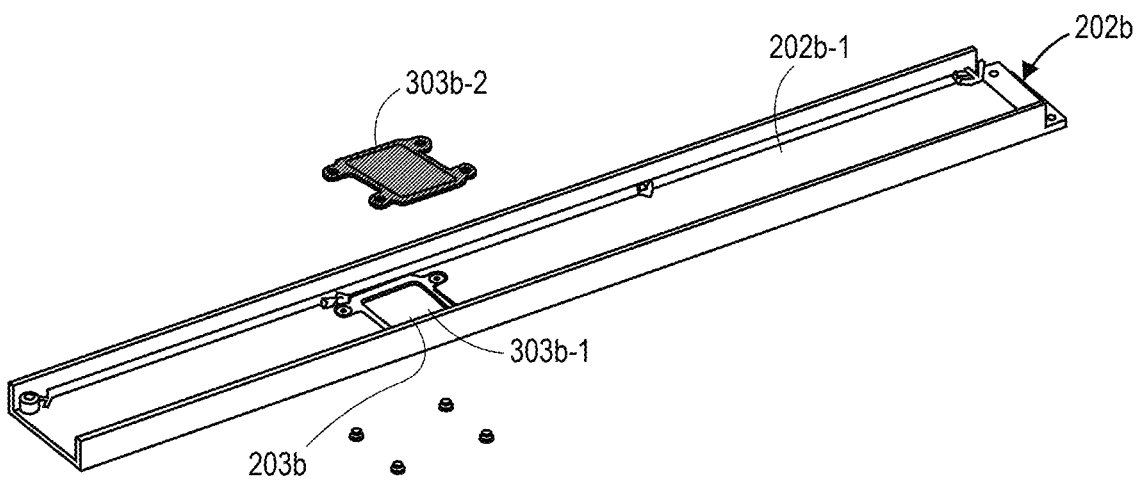
FIG. 3B is an exploded perspective view illustrating a bottom enclosure assembly for the SSD of FIG. 2, according to an embodiment.

FIG. 3A is an exploded perspective view illustrating a top enclosure assembly for the SSD of FIG. 2, and FIG. 3B is an exploded perspective view illustrating a bottom enclosure assembly for the SSD of FIG. 2, both according to embodiments. According to an embodiment, the thermal conduction inhibitor 203*a* (FIGS. 2, 3A) comprises a through-hole 303*a*-1 through the first enclosing structure 202*a*-1 of the first enclosure part 202*a*, and/or the thermal conduction inhibitor 203*b* (FIGS. 2, 3B) comprises a through-hole 303*b*-1 through the second enclosing structure 202*b*-1 of the second enclosure part 202*b*. According to a related embodiment, a low thermal conductivity material 303*a*-2, 303*b*-2 (e.g., a "thermal splitter") is disposed within one or both respective through-hole 303*a*-1, 303*b*-1, where the thermal conductivity of the low thermal conductivity material 303*a*-2, 303*b*-2 is less than the thermal conductivity of the material of which the respective first and second enclosing structure 202*a*-1, 202*b*-1 is composed. For example, each enclosing structure 202*a*-1, 202*b*-1 may be composed of aluminum (e.g., an aluminum alloy) while the low thermal conductivity material 303*a*-2, 303*b*-2 embedded within the corresponding through-hole 303*a*-1, 303*b*-1 (e.g., coupled to the enclosing structure 202*a*-1, 202*b*-1 with a set of fasteners) is composed of a plastic or a stainless steel. Such an embodiment further thermally isolates/insulates the relatively high-temperature ASIC controller and PMICs for example, i.e., the high power and high temperature tolerance components, from NAND packages that have a significantly lower temperature limit. Note that temperature margin (e.g., operating temperature limit minus "measured" junction temperature) of each type of electronic component is of interest in the context of optimizing respective component temperatures. While the ASIC controller, for example, consumes more power and therefore typically runs hotter than the NAND, the ASIC also has a higher temperature limit and thus has been identified as having a higher thermal margin (e.g., less thermal risk). Compared with a conventional one piece enclosure design, simulation has shown that an enclosure as described may provide approximately 1.4° C. extra thermal margin to the NAND packages which are generally known to be negatively impacted by excessive heat and thus more thermally challenged to meet design specifications.

Figure 4A:
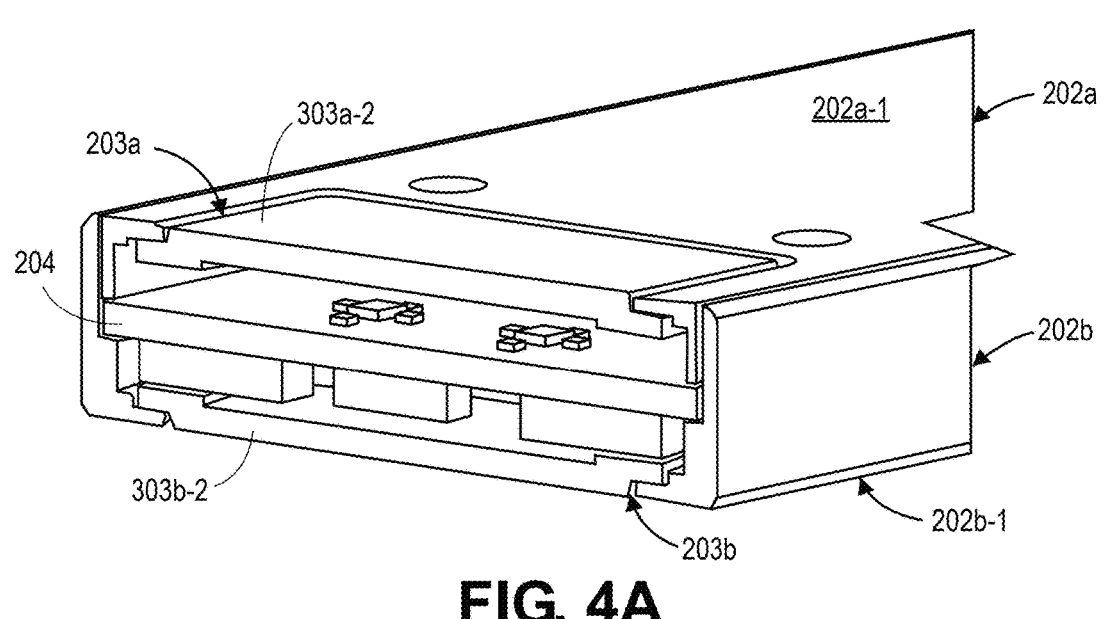
FIG. 4A is a cross-sectional view illustrating the SSD of FIG. 2, according to an embodiment.
Figure 4B:
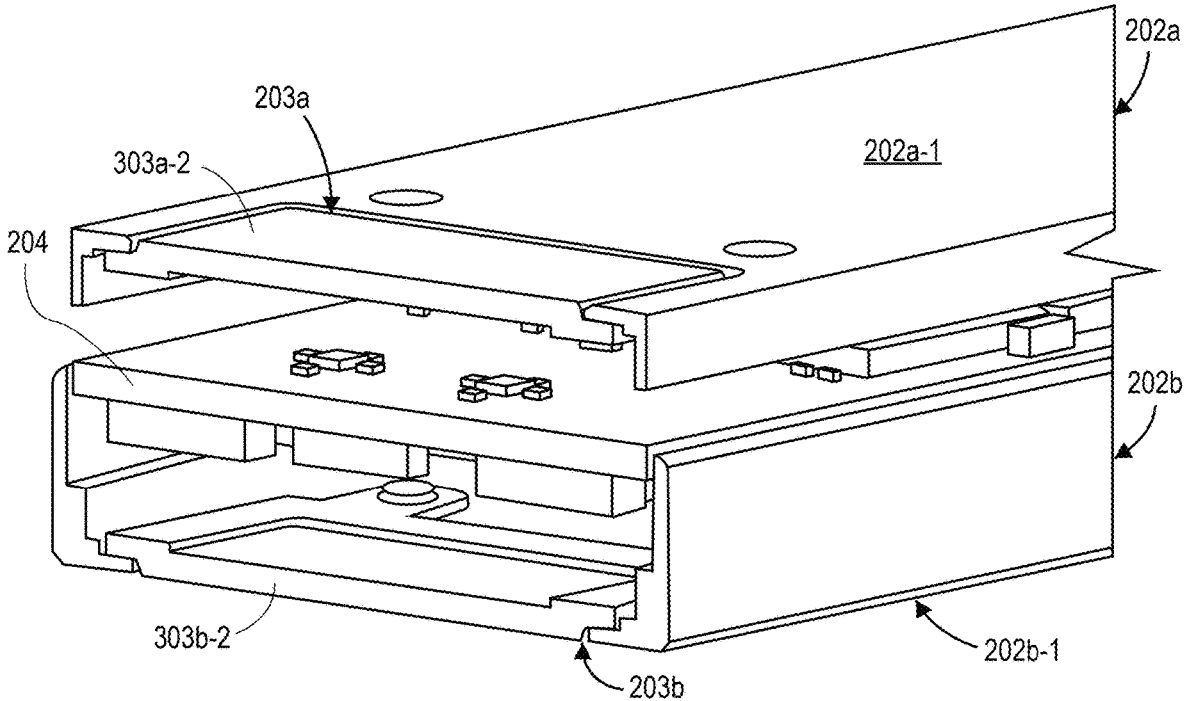
FIG. 4B is an exploded cross-sectional view illustrating the SSD of FIG. 2, according to an embodiment.

FIG. 4A is a cross-sectional view illustrating the SSD of FIG. 2, and FIG. 4B is an exploded cross-sectional view illustrating the SSD of FIG. 2, both according to embodiments. FIGS. 4A-4B provide additional illustration of the embedded "thermal splitter" components, e.g., the low thermal conductivity material 303*a*-2, 303*b*-2. As described in reference to FIGS. 3A-3B, according to an embodiment the thermal conduction inhibitor 203*a* (e.g., see also FIGS. 2, 3A) may comprise a through-hole 303*a*-1 (FIG. 3A) through the first enclosing structure 202*a*-1 of the first enclosure part 202*a*, with a corresponding low thermal conductivity material 303*a*-2 disposed therein. Likewise, according to an embodiment the thermal conduction inhibitor 203*b* (e.g., see also FIGS. 2, 3B) may comprise a through-hole 303*b*-1 (FIG. 3B) through the second enclosing structure 202*b*-1 of the second enclosure part 202*b*, with a corresponding low thermal conductivity material 303*b*-2 disposed therein.

Figure 5A:
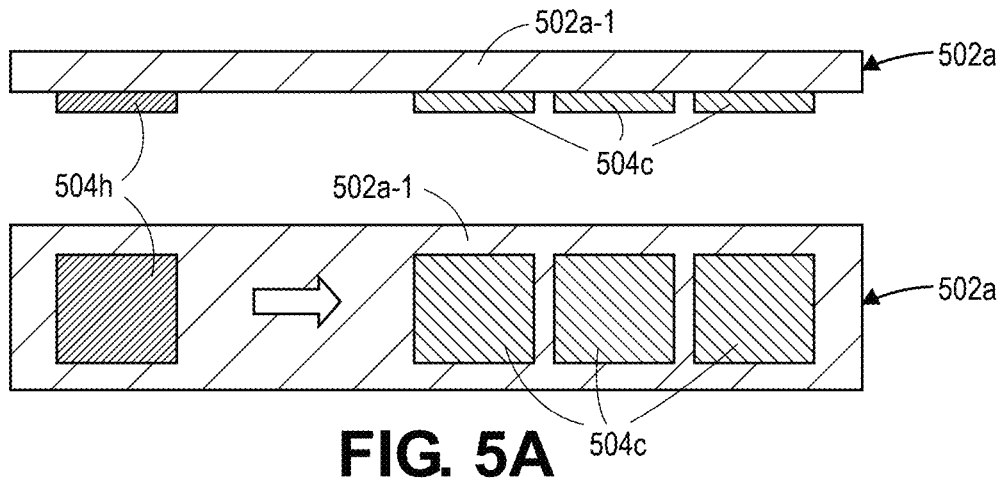
FIG. 5A is a diagram illustrating a prior heat spreader for an SSD enclosure.

FIG. 5A is a diagram illustrating a prior heat spreader for an SSD enclosure. A side view (upper image) and a plan view (lower image) of a top enclosing structure 502*a*-1 of an enclosing part 502*a* depicts a prior heat spreader approach to limiting the amount of heat that may conduct through the enclosing structure 502*a*-1 from a relatively high-temperature electronic component 504*h* (e.g., an ASIC) to a relatively low-temperature electronic component 504*c* (e.g., a group of NAND dies). The approach depicted here relies on a simple gap between the positioning of the relatively high-temperature electronic component 504*h* and the relatively low-temperature electronic component 504*c* of a corresponding PCB (e.g., only a simplified version of PCB electronic components depicted here and subsequently for general positional context, and not drawn to scale).

Figure 5B:
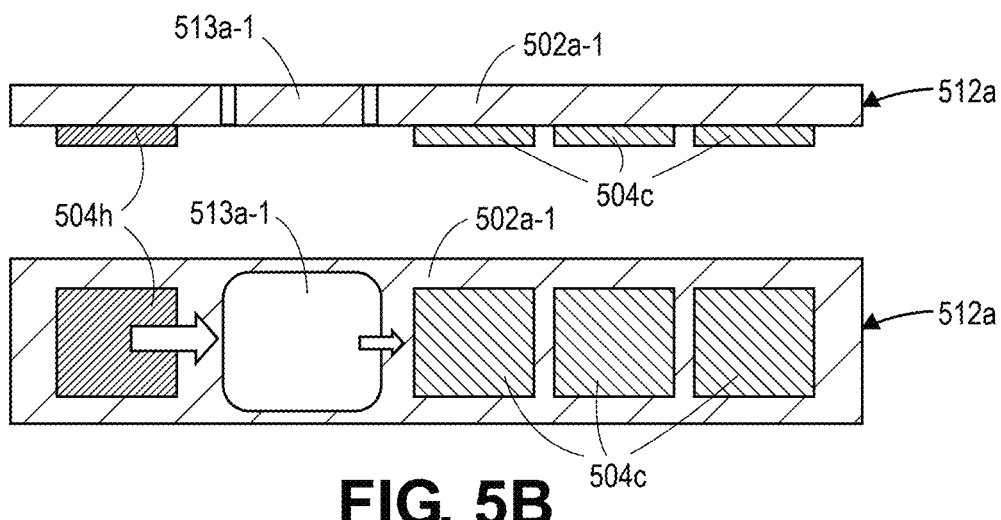
FIG. 5B is a diagram illustrating a heat-mitigating enclosure for an SSD enclosure, according to an embodiment.

FIG. 5B is a diagram illustrating a heat-mitigating enclosure for an SSD enclosure, according to an embodiment. A cross-sectional side view (upper image) and a plan view (lower image) of a top enclosing structure 512*a*-1 of an enclosing part 512*a* depicts a thermal conduction inhibitor approach to limiting the amount of heat that may conduct through the enclosing structure 512*a*-1 from a relatively high-temperature electronic component 504*h* (e.g., an ASIC) to a relatively low-temperature electronic component 504*c* (e.g., a group of NAND dies). The embodiment depicted here relies on a through-hole 513*a*-1 between the positioning of the relatively high-temperature electronic component 504*h* and the relatively low-temperature electronic component 504*c* of a corresponding PCB, with the block arrows (not intended to be to scale thermally) generally depicting the diminishment of thermal conduction from the "hot" region (e.g., ASIC 504*h* position) to the "cool" region (e.g., NAND 504*c* position). Note that the precise size and shape of the through-hole 513*a*-1 may vary from implementation to implementation, as long as such a thermal conduction inhibitor is positioned largely between the hot and cool components/regions.

Figure 5C:
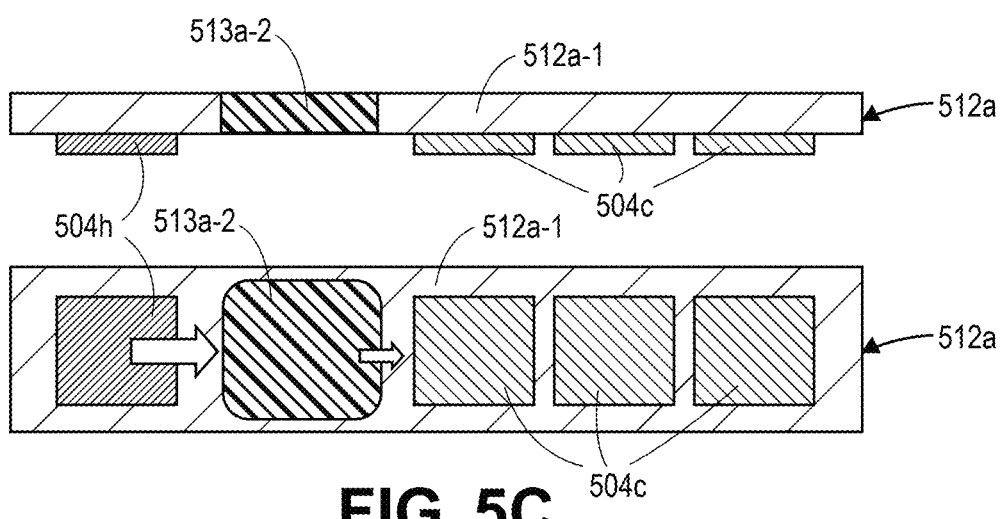
FIG. 5C is a diagram illustrating the heat-mitigating enclosure of FIG. 5B with an embedded thermal splitter, according to an embodiment.

FIG. 5C is a diagram illustrating the heat-mitigating enclosure of FIG. 5B with an embedded thermal splitter, according to an embodiment. A cross-sectional side view (upper image) and a plan view (lower image) of the top enclosing structure 512*a*-1 of the enclosing part 512*a* depicts a thermal conduction inhibitor approach to limiting the amount of heat that may conduct through the enclosing structure 512*a*-1 from a relatively high-temperature electronic component 504*h* (e.g., an ASIC) to a relatively low-temperature electronic component 504*c* (e.g., a group of NAND dies). The embodiment depicted here relies on a through-hole 513*a*-1 (see, e.g., FIG. 5B), and a corresponding low thermal conductivity material 513*a*-2 disposed therein, between the positioning of the relatively high-temperature electronic component 504*h* and the relatively low-temperature electronic component 504*c* of a corresponding PCB, with the block arrows (not intended to be to scale thermally) generally depicting the diminishment of thermal conduction from the "hot" region to the "cool" region.

Figure 5D:
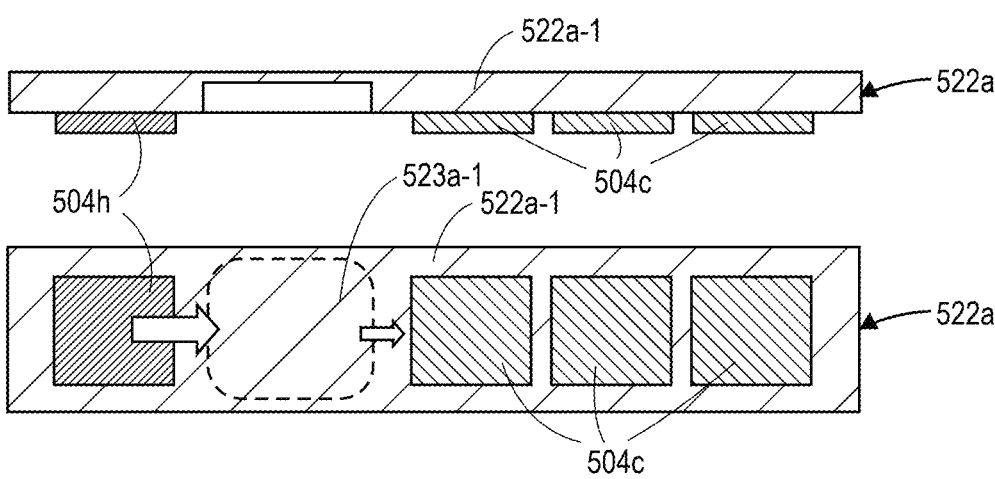
FIG. 5D is a diagram illustrating a heat-mitigating enclosure for an SSD enclosure, according to an embodiment.

FIG. 5D is a diagram illustrating a heat-mitigating enclosure for an SSD enclosure, according to an embodiment. A cross-sectional side view (upper image) and a plan view (lower image) of a top enclosing structure 522*a*-1 of an enclosing part 522*a* depicts a thermal conduction inhibitor approach to limiting the amount of heat that may conduct through the enclosing structure 522*a*-1 from a relatively high-temperature electronic component 504*h* (e.g., an ASIC) to a relatively low-temperature electronic component 504*c* (e.g., a group of NAND dies). The embodiment depicted here relies on a recessed portion 523*a*-1 extending through a portion of the enclosing structure 522*a*-1 between the positioning of the relatively high-temperature electronic component 504*h* and the relatively low-temperature electronic component 504*c* of a corresponding PCB, with the block arrows (not intended to be to scale thermally) generally depicting the diminishment of thermal conduction from the "hot" region (e.g., ASIC 504*h* position) to the "cool" region (e.g., NAND 504*c* position). As with the embodiment illustrated and described in reference to FIG. 5C, here too according to an embodiment a corresponding low thermal conductivity material such as 513*a*-2 (FIG. 5C) may be disposed within the recessed portion 523*a*-1 of enclosing structure 522*a*-1. Note that the precise size and shape of the recessed portion 523*a*-1 may vary from implementation to implementation, as long as such a thermal conduction inhibitor is positioned largely between the hot and cool components/regions.

Figure 5E:
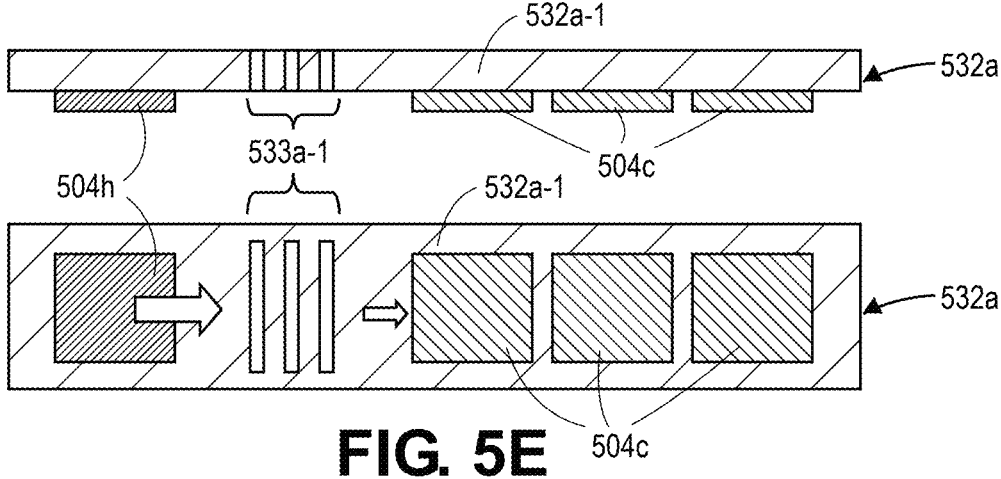
FIG. 5E is a diagram illustrating a heat-mitigating enclosure for an SSD enclosure, according to an embodiment.

FIG. 5E is a diagram illustrating a heat-mitigating enclosure for an SSD enclosure, according to an embodiment. A cross-sectional side view (upper image) and a top view (lower image) of a top enclosing structure 532*a*-1 of an enclosing part 532*a* depicts a thermal conduction inhibitor approach to limiting the amount of heat that may conduct through the enclosing structure 532*a*-1 from a relatively high-temperature electronic component 504*h* (e.g., an ASIC) to a relatively low-temperature electronic component 504*c* (e.g., a group of NAND dies). The embodiment depicted here relies on a grouping of slits 533*a*-1 through the enclosing structure 532*a*-1 between the positioning of the relatively high-temperature electronic component 504*h* and the relatively low-temperature electronic component 504*c* of a corresponding PCB, with the block arrows (not intended to be to scale thermally) generally depicting the diminishment of thermal conduction from the "hot" region (e.g., ASIC 504*h* position) to the "cool" region (e.g., NAND 504*c* position). Note that the precise size, shape, orientation, number, configuration of the grouping of slits 533*a*-1 may vary from implementation to implementation, as long as such a thermal conduction inhibitor is positioned largely between the hot and cool components/regions. For a non-limiting example, the grouping of slits 533*a*-1 may be oriented at an angle to the outer edges rather than extending normal to the outer edges as depicted in FIG. 5E.

Figure 5F:
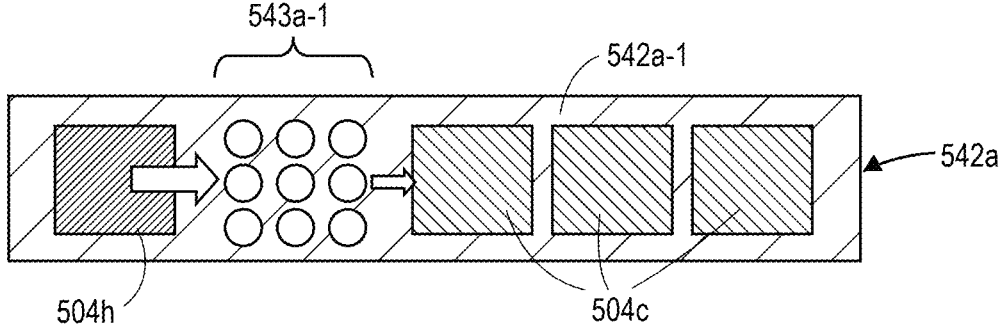
FIG. 5F is a diagram illustrating a heat-mitigating enclosure for an SSD enclosure, according to an embodiment.

FIG. 5F is a diagram illustrating a heat-mitigating enclosure for an SSD enclosure, according to an embodiment. A cross-sectional side view (upper image) of a top enclosing structure 542*a*-1 of an enclosing part 542*a* depicts a thermal conduction inhibitor approach to limiting the amount of heat that may conduct through the enclosing structure 542*a*-1 from a relatively high-temperature electronic component 504*h* (e.g., an ASIC) to a relatively low-temperature electronic component 504*c* (e.g., a group of NAND dies). The embodiment depicted here relies on a grouping (e.g., an array) of holes 543*a*-1 through the enclosing structure 542*a*-1 between the positioning of the relatively high-temperature electronic component 504*h* and the relatively low-temperature electronic component 504*c* of a corresponding PCB, with the block arrows (not intended to be to scale thermally) generally depicting the diminishment of thermal conduction from the "hot" region (e.g., ASIC 504*h* position) to the "cool" region (e.g., NAND 504*c* position). Note that the precise size, shape, number, configuration of the grouping of holes 543*a*-1 may vary from implementation to implementation, as long as such a thermal conduction inhibitor is positioned largely between the hot and cool components/regions.

Method of Assembling a Data Storage Device

FIG. 6 is a flow diagram illustrating a method of assembling a data storage device, according to an embodiment. For example, the method of FIG. 6 may be implemented to assemble a (e.g., solid-state) storage device such as storage device 200 (FIG. 2) as exemplified in the illustrations and descriptions corresponding to FIGS. 2-5F.

At block 602, couple a printed circuit board (PCB) comprising a relatively high-temperature electronic means for controlling and a relatively low-temperature electronic means for non-volatile data storage to an enclosure comprising a first enclosing structure and a second enclosing structure, where at least one of the first and second enclosing structures comprises an integral thermal conduction inhibitor positioned between and not over the relatively high-temperature electronic means for controlling and the relatively low-temperature electronic means for non-volatile data storage. For example, PCB 204 (FIGS. 2, 4A-4B) comprising a relatively high-temperature electronic means for controlling (e.g., relatively high-temperature electronic component 204*h* of FIG. 2, 504*h* of FIGS. 5B-5F) and a relatively low-temperature electronic means for non-volatile data storage (e.g., relatively low-temperature electronic component 204*c* of FIG. 2, 504*c* of FIGS. 5B-5F) is coupled to an enclosure part 202*a*, 202*b* (FIGS. 2-4B), 512*a* (FIGS. 5B-5C), 522*a* (FIG. 5D), 532*a* (FIG. 5E), 542*a* (FIG. 5F) comprising a first (e.g., top) enclosing structure 202*a*-1 (FIGS. 2-4B), 512*a*-1 (FIGS. 5B-5C), 522*a*-1 (FIG. 5D), 532*a*-1 (FIG. 5E), 542*a*-1 (FIG. 5F) and a second (e.g., bottom) enclosing structure 202*b*-1 (FIGS. 2-4B), where at least one of the first and second enclosing structures comprises an integral thermal conduction inhibitor part 203*a*, 203*b* (FIGS. 2-4B), 513*a*-1 and 513*a*-2 (FIGS. 5B-5C), 523*a*-1 (FIG. 5D), 533*a*-1 (FIG. 5E), 543*a*-1 (FIG. 5F) positioned between the relatively high-temperature electronic means for controlling and the relatively low-temperature electronic means for non-volatile data storage.

Thus, for a storage device such as an SSD, implementation of one or more thermal conduction inhibitor features described herein enables mitigation and dissipation of the conduction of heat through the corresponding metal enclosure structure itself, such as from a hotter region (e.g., location of ASIC controller and/or PMIC) of the corresponding PCB to a cooler region (e.g., location of NAND memory) of the PCB, between which the thermal conduction inhibitor(s) is positioned. This arrangement can improve drive performance by reducing heat spreading effects from the relatively hot controller(s) region(s) to the relatively cool NAND region(s), thereby diminishing NAND temperature/margin, as the low temperature region is isolated from the high temperature region by interrupting or intervening in the structural continuity of the enclosure structure.

Physical Description of an Illustrative Operating Context

Embodiments may be used in the context of electronic devices including digital data storage devices (DSDs), such as a solid-state drives (SSDs). Thus, FIG. 1 is a block diagram illustrating a generic SSD architecture 150, for an example operating context of an electronic device with which embodiments of the invention may be implemented. The generic SSD architecture 150 depicts an SSD 152 communicatively coupled with a host 154 through a primary communication interface 156. SSD implementations are not limited to a configuration as depicted in FIG. 1, as embodiments may be implemented with SSD configurations other than that illustrated in FIG. 1 and/or with electronic devices other than SSDs.

Host 154 broadly represents any type of computing hardware, software, or firmware (or any combination of the foregoing) that makes, among others, data I/O requests or calls to one or more memory device. For example, host 154 may be an operating system executing on a computer, a tablet, a mobile phone, or generally any type of computing device that contains or interacts with storage memory. The primary interface 156 coupling host 154 to SSD 152 may be, for example, a storage system's internal bus or a communication cable or a wireless communication link, or the like.

The example SSD 152 illustrated in FIG. 1 includes an interface 160, a controller 162 (e.g., a controller having firmware logic therein), an addressing 164 function block, data buffer cache 166, and one or more non-volatile memory (NVM) components 170*a*, 170*b*-170*n*, where n represents an arbitrary number of NVM components that may vary from implementation to implementation.

Interface 160 is a point of interaction between components, namely SSD 152 and host 154 in this context, and is applicable at the level of both hardware and software. This enables a component to communicate with other components via an input/output (IO) system and an associated protocol. A hardware interface is typically described by the mechanical, electrical and logical signals at the interface and the protocol for sequencing them. Some non-limiting examples of common and standard interfaces include SCSI (Small Computer System Interface), SAS (Serial Attached SCSI), and SATA (Serial ATA).

An SSD 152 includes a controller 162, which incorporates the electronics that bridge the non-volatile memory components (e.g., NAND flash) to the host, such as non-volatile memory 170*a*, 170*b*-170*n* to host 154. The controller is typically an embedded processor that executes firmware-level code and can be a significant factor in SSD performance.

Controller 162 interfaces with non-volatile memory 170*a*, 170*b*-170*n* via an addressing 164 function block. The addressing 164 function operates, for example, to manage mappings between logical block addresses (LBAs) from the host 154 to a corresponding physical block address on the SSD 152, namely, on the non-volatile memory 170*a*, 170*b*-170*n* of SSD 152. Because the non-volatile memory page and the host sectors are different sizes, an SSD has to build and maintain a data structure that enables it to translate between the host writing data to or reading data from a sector, and the physical non-volatile memory page on which that data is actually placed. This table structure or "mapping" may be built and maintained for a session in the SSD's volatile memory 172, such as DRAM or some other local volatile memory component accessible to controller 162 and addressing 164. Alternatively, the table structure may be maintained more persistently across sessions in the SSD's non-volatile memory such as non-volatile memory 170*a*, 170*b*-170*n*.

Addressing 164 interacts with data buffer cache 166, in addition to non-volatile memory 170*a*, 170*b*-170*n*. Data buffer cache 166 of an SSD 152 typically uses DRAM as a cache, similar to the cache in hard disk drives. Data buffer cache 166 serves as a buffer or staging area for the transmission of data to and from the non-volatile memory components, as well as serves as a cache for speeding up future requests for the cached data. Data buffer cache 166 is typically implemented with volatile memory so the data stored therein is not permanently stored in the cache, i.e., the data is not persistent.

Finally, SSD 152 includes the one or more non-volatile memory 170*a*, 170*b*-170*n* components. For a non-limiting example, the non-volatile memory components 170*a*, 170*b*-170*n* may be implemented as flash memory (e.g., NAND or NOR flash), or other types of solid-state memory available now or in the future. The non-volatile memory 170*a*, 170*b*-170*n* components are the actual memory electronic components on which data is persistently stored. The non-volatile memory 170*a*, 170*b*-170*n* components of SSD 152 can be considered the analogue to the hard disks in hard-disk drive (HDD) storage devices.

Furthermore, references herein to a data storage device may encompass a multi-medium storage device (or "multi-medium device", which may at times be referred to as a "multi-tier device" or "hybrid drive"). A multi-medium storage device refers generally to a storage device having functionality of both a traditional HDD (see, e.g., HDD 100) combined with an SSD (see, e.g., SSD 150) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A multi-medium storage device may be architected and configured to operate and to utilize the solid-state portion in a number of ways, such as, for non-limiting examples, by using the solid-state memory as cache memory, for storing frequently-accessed data, for storing I/O intensive data, for storing metadata corresponding to payload data (e.g., for assisting with decoding the payload data), and the like. Further, a multi-medium storage device may be architected and configured essentially as two storage devices in a single enclosure, i.e., a traditional HDD and an SSD, with either one or multiple interfaces for host connection.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An electronic storage device, comprising:
an enclosure comprising:
    a top enclosure part; and
    a bottom enclosure part coupled with the top enclosure part; and
  a printed circuit board (PCB) housed in the enclosure and comprising a high-temperature electronic component and a low-temperature electronic component; and
    a thermal conduction inhibitor interposed in at least one of the top enclosure part and the bottom enclosure part and comprising a structural interruption in a continuous body of the at least one of the top enclosure part and the bottom enclosure part, the thermal conduction inhibitor positioned between an edge of the relatively high-temperature electronic component of the PCB and an edge of the relatively low-temperature electronic component of the PCB and inhibiting thermal conduction through the at least one of the top enclosure part and the bottom enclosure part from the relatively high-temperature electronic component to the relatively low-temperature electronic component.

2. The electronic storage device of claim 1, wherein:
the relatively high-temperature electronic component is a controller; and
the relatively low-temperature electronic component is a solid-state memory component.

3. The electronic storage device of claim 1, wherein:
the relatively high-temperature electronic component is a power management integrated circuit; and
the relatively low-temperature electronic component is a solid-state memory component.

4. The electronic storage device of claim 1, wherein the thermal conduction inhibitor comprises a through-hole through the at least one of the top enclosure part and the bottom enclosure part.

5. The electronic storage device of claim 4, further comprising a low thermal conductivity material disposed within the through-hole, the low thermal conductivity material having a thermal conductivity that is less than a thermal conductivity of a material of which the at least one of the top enclosure part and the bottom enclosure part is composed.

6. The electronic storage device of claim 1, wherein the thermal conduction inhibitor comprises a recessed portion extending through a portion of the at least one of the top enclosure part and the bottom enclosure part.

7. The electronic storage device of claim 6, further comprising:
  a low thermal conductivity material embedded within the recessed portion, the low thermal conductivity material having a thermal conductivity that is less than a thermal conductivity of a material of which the at least one of the top enclosure part and the bottom enclosure part is composed.

8. The electronic storage device of claim 1, wherein the thermal conduction inhibitor comprises a grouping of slits through the at least one of the top enclosure part and the bottom enclosure part.

9. The electronic storage device of claim 1, wherein the thermal conduction inhibitor comprises a grouping of holes through the at least one of the top enclosure part and the bottom enclosure part.

10. The electronic storage device of claim 1, wherein each of the top enclosure part and the bottom enclosure part comprises a respective thermal conduction inhibitor.

11. The electronic storage device of claim 10, wherein each respective thermal conduction inhibitor is aligned with the other respective thermal conduction inhibitor such that the structural interruptions in the top enclosure part and the bottom enclosure part are vertically aligned relative to the PCB.

12. An enclosure for a solid-state storage device, comprising:
  a first enclosure part;
  a second enclosure part coupled with the first enclosure part;
  a thermal conduction inhibitor means comprising a structural interruption in at least one of the first enclosure part and the second enclosure part and positioned between an edge of a relatively high-temperature electronic component of a printed circuit board (PCB) and an edge of a relatively low-temperature electronic component of the PCB that is provided within the enclosure, the thermal conduction inhibitor means inhibiting thermal conduction through the at least one of the first enclosure part and the second enclosure part from the relatively high-temperature electronic component to the relatively low-temperature electronic component.

13. The enclosure of claim 12, wherein the thermal conduction inhibitor means comprises a through-hole through a portion of the at least one of the first enclosure part and the second enclosure part.

14. The enclosure of claim 13, further comprising:

a low thermal conductivity material disposed within the through-hole, the low thermal conductivity material having a thermal conductivity that is less than a thermal conductivity of a material of which the at least one of the first enclosure part and the second enclosure part is composed.

15. The enclosure of claim 14, wherein the low thermal conductivity material is composed of at least one of plastic and stainless steel.

16. The enclosure of claim 12, wherein the thermal conduction inhibitor means comprises a grouping of slits.

17. The enclosure of claim 12, wherein the thermal conduction inhibitor means comprises a grouping of holes.

18. The enclosure of claim 12, wherein each of the first enclosure part and the second enclosure part comprises a respective thermal conduction inhibitor means.

19. A method, comprising:

coupling a printed circuit board (PCB) comprising a relatively high-temperature electronic means for controlling and a relatively low-temperature electronic means for non-volatile data storage to an enclosure comprising a first enclosing structure and a second enclosing structure, the first enclosing structure and the second enclosing structure comprising a continuous body;

wherein at least one of the first enclosing structure and the second enclosing structure comprises a thermal conduction inhibitor having a structural interruption in the continuous body of the at least one of the first enclosing structure and the second enclosing structure, the thermal conduction inhibitor being integral with the at least one of the first enclosing structure and the second enclosing structure and positioned between an edge of the relatively high-temperature electronic means for controlling and an edge of the relatively low-temperature electronic means for non-volatile data storage to inhibit thermal conduction through the at least one of the first enclosing structure and the second enclosing structure from the relatively high-temperature electronic means for controlling to the relatively low-temperature electronic means for non-volatile data storage.

20. The method of claim 19, wherein coupling the PCB to the enclosure includes coupling the PCB to each of the first enclosing structure and the second enclosing structure.

* * * * *